United States Patent [19]
Proebsting et al.

[11] Patent Number: 5,731,713
[45] Date of Patent: Mar. 24, 1998

[54] TTL TO CMOS LEVEL TRANSLATOR WITH VOLTAGE AND THRESHOLD COMPENSATION

[75] Inventors: Robert J. Proebsting, Los Altos Hills; Hyunsoo Sim, Santa Clara, both of Calif.

[73] Assignee: Townsend and Townsend and Crew LLP, San Francisco, Calif.

[21] Appl. No.: 704,179

[22] Filed: Aug. 27, 1996

Related U.S. Application Data

[63] Continuation of Ser. No. 189,372, Jan. 31, 1994, abandoned.

[51] Int. Cl.$^6$ .............................................. H03K 19/094
[52] U.S. Cl. .............................................. 326/71; 326/81
[58] Field of Search ................................. 307/451, 443, 307/475, 296.8; 326/71, 81, 70, 33; 327/543

[56] References Cited

U.S. PATENT DOCUMENTS

| | | | |
|---|---|---|---|
| 4,471,242 | 9/1984 | Noufer et al. | 307/451 |
| 4,642,488 | 2/1987 | Parker | 307/451 |
| 4,675,557 | 6/1987 | Huntington | 307/475 |
| 4,791,323 | 12/1988 | Austin | 307/451 |
| 4,820,937 | 4/1989 | Hsieh | 307/475 |
| 4,843,265 | 6/1989 | Jiang | 307/296.8 |
| 4,890,051 | 12/1989 | Kim et al. | 307/475 |
| 4,902,915 | 2/1990 | Tran | 307/451 |
| 5,041,741 | 8/1991 | Steele | 307/443 |
| 5,087,841 | 2/1992 | Rogers | 307/451 |
| 5,136,189 | 8/1992 | Demaris | 307/451 |
| 5,216,299 | 6/1993 | Wanlass | 307/451 |

OTHER PUBLICATIONS

Miyamoto, Hiroshi, et al., "Improved Address Buffers, TTL Input Current Reduction, and Hidden Refresh Test Mode in a 4–Mb DRAM, " IEEE Journal of Solid–State Circuits, 25(2): 525–530; Apr. 1990.

Sedra et al., "Microelectronic Circuits"; © 1987 by Holt, Richard and Winston, Inc., p. 353.

Chen, "CMOS Devices and Technology for VLSI", © 1990 by Prentice–Hall, Inc., pp. 94–98.

*Primary Examiner*—Edward P. Westin
*Assistant Examiner*—Benjamin D. Driscoll
*Attorney, Agent, or Firm*—Townsend and Townsend and Crew LLP

[57] ABSTRACT

A CMOS input buffer is described for such CMOS circuits as dynamic random access memories, microprocessors, and the like, for receiving TTL logic high and low level signals. The input buffer includes an input stage formed from a p-channel and n-channel MOS transistors configured to have substantially equal transconductances, connected to form a series current path between a bias voltage and a lower voltage (e.g., ground), setting the trip point of the input stage approximately midway between the typically specified TTL logic high and low levels. The differential between the bias and lower voltages from which the input buffer operates assures that at least one of the MOS transistors is off for a TTL logic high or low level input, obviating power consumption while the input signal is at such level. The input buffer is also made insensitive to symmetrical power supply noise, consumes less power, and is made insensitive to threshold voltage variations.

18 Claims, 3 Drawing Sheets

TTL TO CMOS LEVEL TRANSLATOR WITH VOLTAGE AND THRESHOLD COMPENSATION

This is a continuation of application Ser. No. 08/189,372, filed Jan. 31, 1994, now abandoned.

BACKGROUND OF THE INVENTION

The present invention is directed generally to a input buffer circuit and more particularly to a TTL compatible CMOS input buffer circuit. The circuit provides a switching threshold voltage relatively independent of both transistor threshold voltages and symmetrical noise at the power supply input nodes to the circuit.

The state of the art today in semiconductor fabrication technology enables digital circuits to be implemented in many different technologies, including bipolar, field effect, complementary field effect (CMOS) and others. These technologies permit various types of logic, each having its own advantages and disadvantages. For example, transistor-transistor-logic (TTL) employs bipolar transistors and provides circuits widely available in fast, large scale integration. Field effect (MOS) technology is not as fast but provides higher densities that characterize microprocessors, memories, and the like.

Various technologies are often mixed to form a complete system. For example, a digital system can include TTL control circuitry and CMOS data storage implemented as static or dynamic random access memory. Input and output buffers provide the interfaces between the technologies, respectively accepting TTL signals and referring them to the CMOS environment, or vice versa.

CMOS technology provides complementary conductivity-type transistors; n-channel MOS (NMOS) and p-channel MOS (PMOS). The NMOS devices are on when their gate electrodes are biased positively, while the PMOS devices are off. Conversely, the PMOS devices are on when their gate electrodes are biased negatively, while the NMOS devices are off. With this technology, a logic inverter is formed from a totem configuration of a PMOS transistor that connects an upper supply voltage to an output node, and an NMOS transistor that connects a lower supply voltage to the output node. The gate nodes of both transistors are connected together to the input node. Due to the voltage difference between the logic states "1" and "0", CMOS circuits have relatively high noise immunity. Furthermore, when the input signal is steady at either supply voltage, one of the two transistors in series is not conductive, and the logic gate consumes essentially zero power.

Consuming essentially zero power at this condition does not mean, however, that CMOS circuits are not consumptive of power as other input voltages, or are not susceptible to noise. This is explained further in conjunction with FIGS. 1A and 1B.

FIG. 1A illustrates a prior art CMOS input stage 12 which comprises a PMOS transistor Q1 and an NMOS transistor Q2, providing a TTL compatible CMOS input buffer. A TTL circuit 10 provides an input signal of potential ($V_i$) to the input stage 12. The two transistors Q1 and Q2 are connected between a positive supply voltage $V_{cc}$, typically 5 volts, and a lower supply voltage $V_{ss}$, typically ground. (The symbol for PMOS transistor has a circle on the gate node.) The interconnection between the PMOS and NMOS transistors provides the output terminal of the input stage 12 at which the output voltage $V_o$ developed by the stage is provided.

In circuits employing it, the input stage 12 has a "trip point" at which input voltage ($V_i$) causes transistors Q1 and Q2 to conduct essentially the same saturation current. The trip point is also that input voltage level above which the NMOS transistor Q2 pulls the output $V_o$ toward ground, and below which the PMOS transistor Q1 pulls the output $V_o$ toward $V_{cc}$.

The trip point of the CMOS input stage 12 is usually selected to be midway between specified $V_i$ high and low input levels of 2.4 and 0.8 volts, or somewhere in the range of 1.6 volts. However, when the input voltage $V_i$ is at any level both above the threshold voltage ($V_t$ or $V_{tn}$) of the NMOS transistor Q2 (approximately 0.8 volts) and also below $V_{cc}$ less the threshold voltage ($V_t$ or $V_{tp}$) of the PMOS transistor Q1, both Q1 and Q2 are conductive. A current flows from $V_{cc}$ to $V_{ss}$ and the circuit consumes power. Thus, even though many TTL circuits are capable of producing a high output logic level above their specified minimum level of 2.4 volts, they typically do not reach an output level (i.e., $V_{cc}$ less one PMOS threshold) sufficient to turn off the PMOS transistor. Therefore, when the TTL circuit 10 provides input signal $V_i$ at an insufficiently high level to the input stage 12, both transistors of the CMOS pair are on, causing current to flow from $V_{cc}$ to $V_{ss}$, and consuming power.

Prior art 5 volt TTL compatible CMOS static input buffers usually have the trip point asymmetrically set between $V_{cc}$ and $V_{ss}$ (usually at about 1.6 volts above $V_{ss}$ and 3.4 volts below $V_{cc}$). This asymmetrical positioning is the reason that many static input buffers are particularly susceptible to noise presented on the $V_{ss}$ input terminal.

Power supply noise is best understood with reference to FIG. 1B. FIG. 1B illustrates an integrated circuit 14 having a $V_{cc}$ terminal connected to a $V_{cc}$ supply voltage by pin connection 13, and a $V_{ss}$ terminal connected to $V_{ss}$ supply by pin connection 15. Although in commercial designs every effort is made to keep the impedances of these pin connections low, there are non-negligible inductances. These inductances are illustrated in FIG. 1B by the supply lead inductance L1, and the corresponding, essentially equal, ground or return lead inductance L2.

Some CMOS devices, such as a dynamic random access memory (DRAM), draw essentially zero current at standby, but rapidly switch to high current consumption at the start of an active cycle. Because the instantaneous voltage across an inductor is L(di/dt), the rapid change in current (di/dt) multiplied by the lead inductance L is capable of developing as much as 1 volt across L1. Because the circuit 14 does not store charge (and neglecting any current through output pins), the supply current $I_1$, is substantially equal to the return current $I_2$ so that $di_1/dt=di_2/dt$. Furthermore, because inductances L1 and L2 are substantially equal, a 1 volt drop across L1 also appears as a 1 volt drop across the inductance L2. The result is that the during increasing current, the potential at the $V_{cc}$ terminal drops by the same amount that the potential at the $V_{ss}$ terminal rises, and visa versa during decreasing current. Thus, a one volt drop across the inductance L2 causes a 1 volt rise at the $V_{ss}$ terminal, while a corresponding one volt drop across the inductance L1 causes a one volt drop at the $V_{cc}$ terminal. The noise is therefore symmetrical. In addition, the output nodes may all switch simultaneously from $V_{ss}$ to $V_{cc}$ (or vice versa), drawing current from $V_{cc}$ (or $V_{ss}$) without a corresponding current in $V_{ss}$ (or $V_{cc}$) which occurs instead in the output leads. This causes asymmetrical noise. This undesired effect is usually prevented by using separate power supply pins to drive the output buffers, so the main power supply noise remains symmetrical.

Unfortunately, as $V_{cc}$ and $V_{ss}$ vary symmetrically, the trip point varies in the prior art circuit of FIG. 1A. At the input switching threshold or trip point, the saturation currents through Q1 and Q2 are equal. To achieve a trip point of 1.6 volts requires design of the circuit so that at 1.6 volts, NMOS transistor Q2 and PMOS transistor Q1 have the same saturation current. At an input voltage of 1.6 volts, NMOS transistor Q2 is turned on by $V_i - V_{ss} - V_t = 1.6 - 0 - 0.8 = 0.8$ volts above its threshold voltage. At the same input voltage of 1.6 volts, with a the magnitude of the PMOS threshold voltage of 0.8 volts and with a $V_{cc}$ supply voltage of 5.0 volts, PMOS transistor Q1 is turned on by $V_{cc} - V_i - |V_{tp}| = 5 - 1.6 - 0.8 = 2.6$ volts. To achieve a trip point of 1.6 volts requires the transconductance, $g_n$, of the NMOS transistor to be much higher than that of the PMOS transistor.

In this example, the NMOS transistor is designed to have a transconductance of 2.6 mA/volt (which multiplied by the previously calculated 0.8 volts gives 2.08 mA), while the PMOS is designed to have a transconductance of 0.8 mA/volt (which multiplied by the previously calculated 2.6 volts also gives 2.08 mA).

In this example, if noise on the power supplies causes $V_{ss}$ to be 1 volt below ground, the conduction through NMOS transistor Q2 increases by 2.6 mA. The symmetry of the power supply move cause $V_{cc}$ to be increased by one volt, causing the conduction through PMOS transistor Q1 to increase by 0.8 mA. Thus, the symmetric noise on the two power supplies caused a very nonsymmetric charge in the saturation currents of Q1 and Q2. This, of course, is due to the different transconductances of Q1 and Q2 which, in turn, was required to achieve the desired trip point of 1.6 volts.

In this example with an assumed 1 volt of symmetric noise on $V_{ss}$ and $V_{cc}$, the trip point moves to 1.07 volts. Calculating the currents for Q2 and Q1 at 1.07 volts input, we find:

$$I_2 = (V_i - V_{ss} - V_t)g_n = \quad\quad\quad\quad\quad\quad (\text{Eq. 1})$$
$$(1.07 - (-1) - 0.8)(2.6 \text{ mA/volt}) = 3.30 \text{ mA}$$

and $$I_1 = (V_{cc} - V_i - |V_{tp}|) =$$
$$(5 + 1 - 1.07 - 0.8)(0.8 \text{ mA/volt}) = 3.30 \text{ mA}.$$

Since the currents are equal at 1.07 volts, the trip point is 1.07 volts. Thus, 1 volt of noise on the power terminals moved the trip point from 1.6 volts to 1.07 volts, a change of 0.53 volts, even though the noise was symmetric. Thus, symmetric noise at the power terminals caused by operation of the integrated circuit, in turn, varies the trip point of input buffers on that circuit. This can cause the input buffers to interpret an externally provided logic "0" as a logic "1", or to interpret an externally provided logic "1" as a logic "0".

The trip point of prior art static CMOS input buffers varies with PMOS and NMOS transistor threshold voltage variations. As indicated above, the trip point of any TTL compatible static CMOS input buffer typically is selected to be midway between specified high and low levels or 1.6 volts. As discussed above, the trip point is most often set by fabricating the PMOS and NMOS transistors with transconductances that cause the transistors to conduct substantially the same current at the trip point. Usually this requires the transconductance of the NMOS transistor to be at least three times larger than that of the PMOS transistor. Variations of the threshold voltage of the PMOS transistor have little effect on the trip point because of its low transconductance. This, however, is not true of variations in the threshold voltage of the NMOS transistor. These variations have a significant effect on the trip point. A one volt increase in NMOS threshold voltage increases the trip point by at least 0.75 volts.

Finally, the trip point of conventional CMOS input buffers can be affected by other subcircuits on the integrated circuit. This occurs because in larger CMOS integrated circuit chips, the placement of many of the input buffers, for convenience, is away from the $V_{ss}$ input terminal to the chip. Metal connections are used on the chip to communicate $V_{ss}$ to the input buffers. This metal has some resistance, particularly in the smallest cross-sections, and the individual stages of CMOS input buffers or other circuitry provide enough current to develop significant voltages across this resistance. In turn, the trip point of the input stage of a CMOS buffer is affected by the current drawn by other circuits sharing the same internal power supply wire.

SUMMARY OF THE INVENTION

The present invention provides a CMOS input buffer that simultaneously achieves three distinct and important objectives. It provides relative insensitivity to symmetrical power supply noise; it provides relative insensitivity to variations in PMOS and NMOS threshold voltages; and finally, it consumes essentially no DC power when the input voltage is a high or low logic level provided by a TTL circuit.

According to the present invention, a CMOS input buffer includes a complementary pair of MOS transistors structured so that they have approximately the same transconductances ($g_p$ for the PMOS transistor, $g_n$ for the NMOS transistor). Then, the trip point of the buffer is set to be midway between the worst case TTL high and low output voltages by connecting the source terminal of the PMOS transistor to a bias circuit that develops a bias voltage lower than the positive supply voltage. The bias circuit develops a bias voltage that makes the trip point independent of threshold voltages and assures that the PMOS transistor does not conduct when the received TTL output voltage is high. (The NMOS transistor is off when the TTL input voltage is low, both in this and prior art circuits.)

In the preferred embodiment of the invention, the input stage uses a PMOS transistor whose drain is connected to the drain of the NMOS transistor. The source of the PMOS transistor is connected to the bias potential. The source of the NMOS transistor is connected to a $V_{ss}$ potential source. The gates of the respective transistors are connected together to an input terminal. Finally, the two CMOS transistors are designed to have approximately equal transconductances.

The bias circuit develops a bias voltage whose ideal magnitude is a fixed, process dependent voltage, equal to a fixed process independent voltage plus the magnitude of one PMOS transistor threshold voltage minus one NMOS transistor threshold voltage. This bias voltage, about 3.2 volts in the preferred embodiment, is applied to the source of the PMOS transistor, thereby placing the trip point of the input stage at about midway between the bias voltage and the $V_{ss}$ potential. In addition, the bias voltage is capacitively coupled to the positive supply voltage so that the source of the PMOS transistor follows noise on the positive supply voltage. Because both transistors have equal traniconductances, symmetric, internally-generated power supply noise momentarily increases the voltage on $V_{cc}$ to cause an increase in the PMOS current, while a simultaneous equal decrease in the voltage of $V_{ss}$ causes the same increase in the NMOS current. Thus, however $V_{ss}$ and $V_{cc}$ vary as a result of such noise, the transistors both conduct equally at the trip point, which remains 1.6 volts above external ground.

Furthermore, when the received TTL output voltage switches high, typically at a voltage level greater than that specified (e.g., 2.4 volts), the voltage of the PMOS transistor gate relative to the 3.2 volt bias on its source becomes less than the PMOS threshold voltage. This causes the PMOS transistor to cease conduction, and no current flows through the CMOS transistor pair. This was not the case in the prior art circuit, unless the input voltage exceeded about 4.2 volts. Nor does current flow when the TTL input voltage is low (typically on the order of 0.4 volts) because the NMOS transistor is off.

Thus, the circuit of FIG. 2, with the PMOS and NMOS transistors having approximately equal transconductances, is relatively power supply noise insensitive. In addition, with a bias voltage on node A set to about 3.2 volts, the circuit has the correct trip point of 1.6 volts and ceases to draw current at any input voltage above about 2.4 volts or below 0.8 volts. There is a problem, however: the output voltage swing is only from $V_{ss}$ to the bias voltage, not to $V_{cc}$, so the next stage (CMOS inverter) draws power. The following embodiments of the invention solve this problem.

In another embodiment of the invention, a CMOS input buffer is formed from a number of CMOS transistor stages connected serially. Each stage has a separate bias circuit from which it operates, with the bias voltage of each succeeding stage being more positive than that of the preceding stage by a voltage whose magnitude is somewhat less than the threshold voltage of a PMOS transistor. (See FIG. 4.) This biasing technique assures that each stage is nonconductive for each received TTL output quiescent state (high or low).

In another embodiment of the invention, the last stage of either a single stage or of multiple stages each separately biased as described above, is provided with a feedback circuit. When the input node of the last stage is driven to a poor high voltage (e.g., approximately 3.2 volts), the feedback circuit pulls this input up to $V_{cc}$, shutting off the PMOS transistor and thereby reducing power consumption. (See FIGS. 5 or 6.)

The preferred embodiment of the invention utilizes a bias voltage having a value equal to a voltage developed by a fixed (process and $V_{cc}$ independent) voltage source, less an NMOS threshold voltage, plus a PMOS threshold voltage. The effect of the inclusion of the NMOS and PMOS threshold voltages is to make the trip point of the input buffer relatively insensitive to process variations of the transistor threshold voltages—a very desirable characteristic.

The advantages of the present invention should now be evident. First, the trip point of a CMOS input buffer constructed according to the present invention is relatively insensitive to internally generated power supply noise; that is, it remains centered between the two operating voltages of the stage: the bias voltage and $V_{ss}$. This feature of the invention minimizes false responses due to power supply noise. Second, the trip point of a static CMOS input buffer constructed according to the present invention is insensitive to processing variations of the PMOS and NMOS transistor threshold voltages to further insure adequate margins under all conditions to prevent false responses. Third, because the PMOS transistor can be placed in a nonconducting state when the received TTL output signal is in a low state or in a high state well below $V_{cc}$, power consumption is reduced. These and other advantages and aspects of the invention will become evident to those skilled in the art upon reading the following detailed description.

DESCRIPTION OF THE SPECIFIC EMBODIMENTS

Figure 1A:
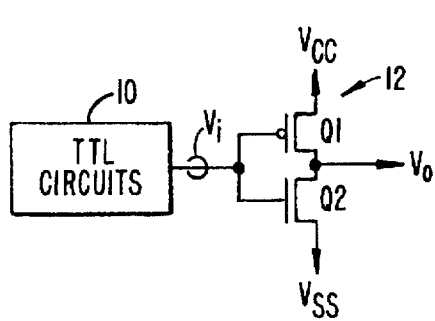
FIGS. 1A and 1B are circuit schematics exemplary of the prior art.
Figure 1B:
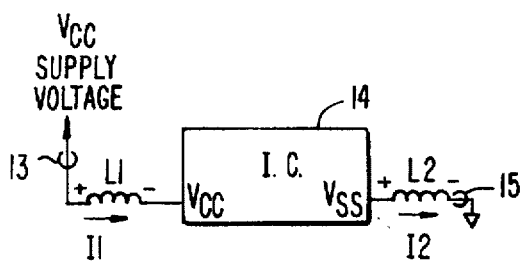
Figure 2:
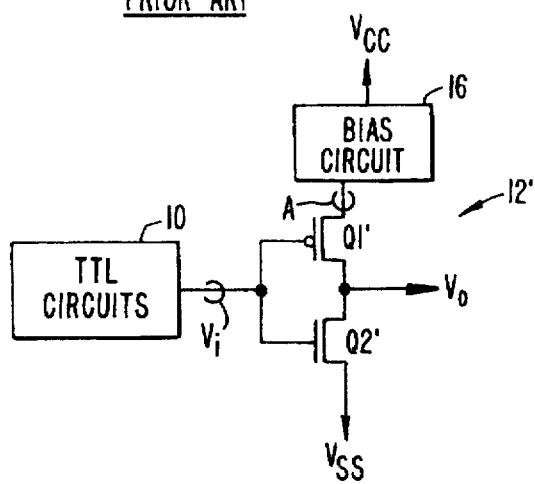
FIG. 2 is a representative input stage of a static input CMOS buffer constructed according to the present invention.

FIG. 2 illustrates one embodiment of an input stage of a static input buffer according to our invention. As FIG. 2 shows, the input stage 12' includes a PMOS transistor Q1' and an NMOS transistor Q2' connected to form an input stage 12'.

Assume that the minimum high and maximum low input logic levels of the CMOS circuit 12' are 2.4 volts for a high input level, and 0.8 volts for a low input level. Preferably, the trip point of the input CMOS stage 12' is midway between these two levels, or 1.6 volts.

The PMOS and NMOS transistors Q1' and Q2' are designed so that their respective transconductances are approximately equal. Thus, the transistors Q1' and Q2' produce the same change in drain to source current in response to the same change in the gate to source voltages. The transconductance of an MOS transistor is proportional to the width of the transistor and (approximately) inversely proportional to the length of the transistor. Matching of the transconductances can be achieved by varying the widths and lengths of the channels of the transistors. Preferably, the length of the MOS transistor is chosen to be as short as possible to provide minimum delay. Thus, the transistor preferably uses the shortest channel that the technology permits, and the width is adjusted as necessary to give the desired transconductance. With conventional short channel MOS transistors the saturation current of the transistor varies approximately linearly with the difference between the gate-to-source voltage and the transistor's threshold voltage. (The saturation current of long channel transistors varies with the square of that difference). For equal transconductances, the PMOS transistor must be wider than the NMOS transistor.

FIG. 2 further shows the source of the PMOS transistor Q1' connected to a voltage node A to which a bias circuit 16 applies a bias voltage. The bias voltage is selected to place the trip point of the CMOS input stage 12' at the desired 1.6 volt level, midway between the high and low input levels. Because the transconductances of the PMOS and NMOS transistors are approximately equal, and assuming that the magnitude of the transistor threshold voltages are approximately equal, the bias voltage must supply a voltage level for the source of the PMOS transistor as much above the desired trip point as the voltage on the source of the NMOS transistor (ground) is below the desired trip point. For a 1.6 volt trip point, the bias voltage on node A of FIG. 2 must be about 3.2 volts. Of course, if the magnitudes of the NMOS and PMOS threshold voltages are not equal, an appropriate change in the bias voltage can be made using the concepts of our invention.

The CMOS input stage 12' operates as follows. Assume the input voltage to stage 12' from TTL circuits 10 is low, i.e., less than 0.8 volts. This places the PMOS transistor Q1' in a conductive state. Assuming the NMOS threshold voltage is 0.8 volts, the NMOS transistor is nonconductive, and no current flows from $V_{cc}$ to $V_{ss}$. If the NMOS threshold voltage is below 0.8 volts, say 0.6 volts, and the input is above 0.6 volts, the NMOS transistor is not completely off and a small current flows. With little or no current being conducted by the NMOS transistor, the PMOS transistor Q1' pulls the output signal $V_o$ up toward the bias voltage at node A of 3.2 volts.

Next, assume that the received TTL output signal $V_i$ switches high, that is, to a voltage above 2.4 volts. This turns on the NMOS transistor Q2'. Because the source of PMOS transistor Q1' at node A is 3.2 volts, and the gate of Q1' is at least 2.4 volts, the gate to source voltage difference is not sufficient to overcome the PMOS threshold of minus 0.8 volts. Therefore, the PMOS transistor Q1' is not conductive. Under this condition, even though the NMOS transistor Q2' is conductive, the CMOS input stage 12' does not conduct current from $V_{cc}$ to $V_{ss}$, and the output signal $V_o$ is pulled by NMOS transistor Q2' to $V_{ss}$.

For process, power supply voltage, and temperature insensitivity, the bias circuit 16 can be implemented using a modified band-gap generator. Such a circuit consists of two parts. The first part is a well known band gap regulator providing a process independent, temperature independent and supply voltage independent 3.2 volt supply. The second part adds the magnitude of one PMOS threshold voltage and subtracts the magnitude of one NMOS transistor threshold voltage from this fixed 3.2 volt supply, using the type of circuitry described below.

Figure 3:
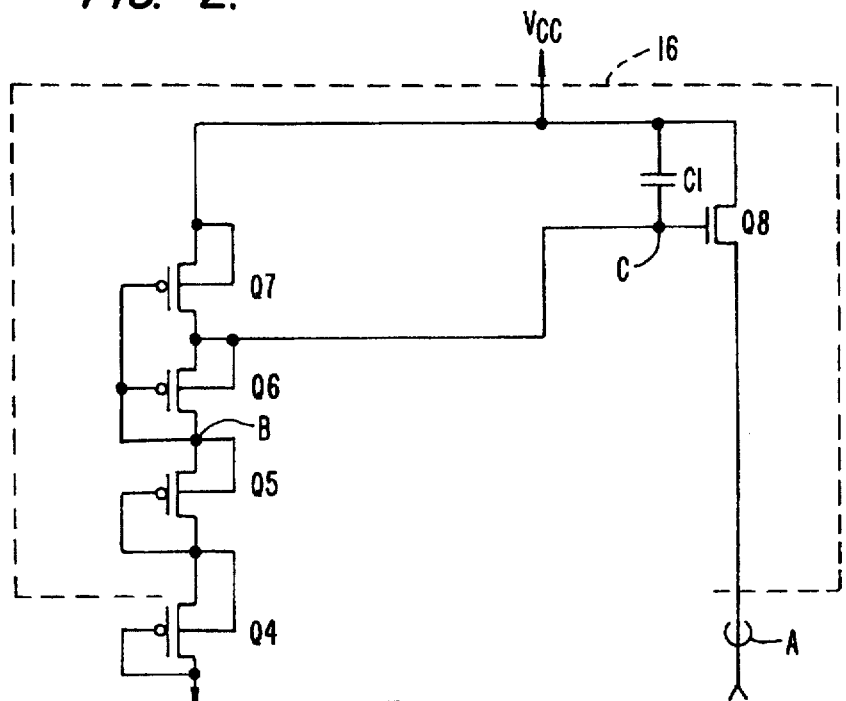
FIG. 3 is a circuit schematic of one bias circuit shown in FIG. 2.

A simpler alternative to a band-gap generator, however, is the bias circuit 16 illustrated in FIG. 3. As shown, the bias circuit 16 includes four PMOS transistors, Q4, Q5, Q6 and Q7 connected source to drain to form a series current path between $V_{ss}$ and $V_{cc}$. The drain of the PMOS transistor Q4 is connected to $V_{ss}$, and the source of the PMOS transistor Q7 is connected to $V_{cc}$. Each of the transistors Q4–Q7 preferably are formed with an N-well CMOS process, and each has its respective well tied to its source. Preferably, transistors Q4, Q5 and Q7 are all long channel, narrow transistors with approximately equal lengths and approximately equal widths, and transistor Q6 is wide and short channel.

The transistors Q4–Q7 develop a bias voltage at node B that is a fixed fraction (about ⅔) of $V_{cc}$, i.e., about 3.2 volts. (The voltage across transistor Q6 is about one PMOS threshold voltage, lowering the drain to source voltage of Q7 by this one threshold voltage, but not lowering the gate to source voltage. This voltage drop across Q6 has almost no effect on the voltage at node B because Q7 remains in saturation). The bias voltage at node C is the voltage developed at node B (3.2 volts), plus the one PMOS threshold voltage (approximately 0.8 volts) of short-channel transistor Q6.

Node C is coupled to the gate of an NMOS transistor Q8 operating as a source follower. The gate of the transistor Q8 is also coupled to $V_{cc}$ by a capacitance C1. The drain of the transistor Q8 is tied to $V_{cc}$, while the source of the transistor Q8 forms the bias voltage that is applied to node A of the input stage 12' (FIG. 2). The capacitance C1 is preferably large enough so that any high frequency noise on $V_{cc}$ generated by operation of the circuit is substantially reflected by the source follower transistor Q8 to node A. The noise so reflected for the most part is the complement of that on $V_{ss}$. Thus, as the voltage on the source terminal of PMOS transistor Q1' (FIG. 2) varies, so does the voltage on the source terminal of the NMOS transistor Q2', but in an opposite direction. In this manner voltage variations appearing at node A and $V_{ss}$, between which transistors Q1' and Q2' form a series current path, are substantially symmetrical.

At the trip point the currents through the CMOS transistor pair Q1' and Q2' (FIG. 2) are equal. The saturation current through the PMOS transistor Q1', I1, is:

$$I1=(V_A-V_i-V_{tp})g_p \qquad \text{(Eq. 2)}$$

where $V_A$ is the voltage at node A, $V_i$ is the voltage at the gates of transistors Q1' and Q2, $V_{tp}$ is the magnitude of the (negative) threshold voltage of the PMOS transistor Q1', and $g_p$ is the transconductance of the PMOS transistor Q1'. (The transistors Q1', Q2' are short channel devices, resulting in the linear relationship of Eq.2, as explained above.)

Similarly, the saturation current through the transistor Q2', assuming $V_{ss}$ is ground, is:

$$I2=(V_i-V_{tn})g_n \qquad \text{(Eq. 3)}$$

where $V_{tn}$ is the threshold voltage of the NMOS transistor Q2', and $g_n$ is the transconductance of the NMOS transistor Q2'.

At the trip point of the input stage 12', the saturation currents are equal: $I1=I2=(V_A-V_i-V_{tp})g_p=(V_i-V_{tn})(g_n)$.

Transistors Q1' and Q2' are sized so that their transconductances ($g_p$ and $g_n$) are substantially equal. Therefore, dividing by the equal transconductance terms ($g_p$, $g_n$), and solving for the trip point $V_i$:

$$2V_i=V_A-V_{tp}+V_{tn} \qquad \text{(Eq. 4)}$$

The voltage at node B (FIG. 3) is a fixed (threshold voltage independent) fraction of the supply voltage, $V_{cc}$. The voltage at node A, $V_A$, therefore is this fixed fraction of $V_{cc}$ raised by the PMOS threshold voltage presented by transistor Q6, and lowered by the NMOS threshold of the transistor Q8. Thus, $$V_A=kV_{cc}+V_{tp}-V_{tn} \qquad \text{(Eq. 5)}$$

where $V_{tp}$ is the magnitude of the threshold voltage of any PMOS transistor including the PMOS transistor Q6, $V_{tn}$ is the threshold voltage of any NMOS transistor including the NMOS transistor Q8 (FIG. 3), and k is the fraction of $V_{cc}$ desired.

If the expression for $V_A$ in Eq. 5 is substituted for $V_A$ in Eq. 4:

$$2V_i=kV_{cc}+V_{tp}-V_{tn}-V_{tp}+V_{tn} \qquad \text{(Eq. 6)}$$

Thus, $$V_i=kV_{cc}/2 \qquad \text{(Eq. 7)}$$

The threshold voltages for the PMOS and NMOS transistors cancel, showing that the trip point, $kV_{cc}/2$, is related directly to the supply voltage, $V_{cc}$, and not to either of the NMOS or PMOS threshold voltages. Thus, the bias circuit illustrated in FIG. 3 establishes a trip point in the circuit of FIG. 2 that is independent of certain of the vagaries of the fabrication process.

Symmetric noise on the power supply input terminals does not effect the trip point. When the input signal is at the trip point, by definition, the NMOS and PMOS saturation currents are equal. With symmetric noise, at some instant $V_{ss}$ can be 0.5 volts below system ground, and $V_{cc}$ 0.5 volts above system supply voltage. Node A is also 0.5 volt above its nominal value due to capacitor C1 in FIG. 3. With $V_{ss}$ 0.5 volt below system ground, the NMOS transistor Q2' current increases by this voltage change (0.5 volt) multiplied by the transconductance ($g_n$) of the NMOS transistor. At the same time, however, the source of PMOS transistor Q1' (on node A) increases by the same 0.5 volt. Because the transconductance $g_p$ of the PMOS transistor Q1' is equal to that of the NMOS transistor Q2', the current through PMOS transistor Q2' increases by the same 0.5 volt multiplied by the same transconductance value $g_p$. Therefore, with symmetric noise, the currents remain equal to each other, just as they were without noise, and the symmetrical noise does not cause the trip point to move.

The input buffer 12' of FIG. 2, using the bias circuit of FIG. 3, has a trip point independent of transistor threshold voltages and independent of symmetric noise on its power supplies—two primary objectives of the present invention. A further advantage is that this stage consumes no steady state power when the input is below about 0.8 volts or above about 2.4 volts. The elimination of steady state power consumption at input potentials above about 2.4 volts is a third important objective. Most prior art circuits require the input potential to be at least $V_{cc}$ minus $V_{tp}$, or about 4.2 volts, to prevent current flow.

Although the bias circuit 16 of FIG. 3 provides a bias voltage at node A so the trip point of the input buffer is substantially insensitive to process variations of MOS threshold voltages, it is dependant upon the supply voltage $V_{cc}$. There may be applications for the input buffer 12' and bias circuit 16 which are exposed to variations in $V_{cc}$ where this response is unacceptable. If so, circuit 16A in FIG. 7 can be employed. Although superficially similar, the circuits of FIGS. 3 and 7 are different in construction and function.

Figure 7:
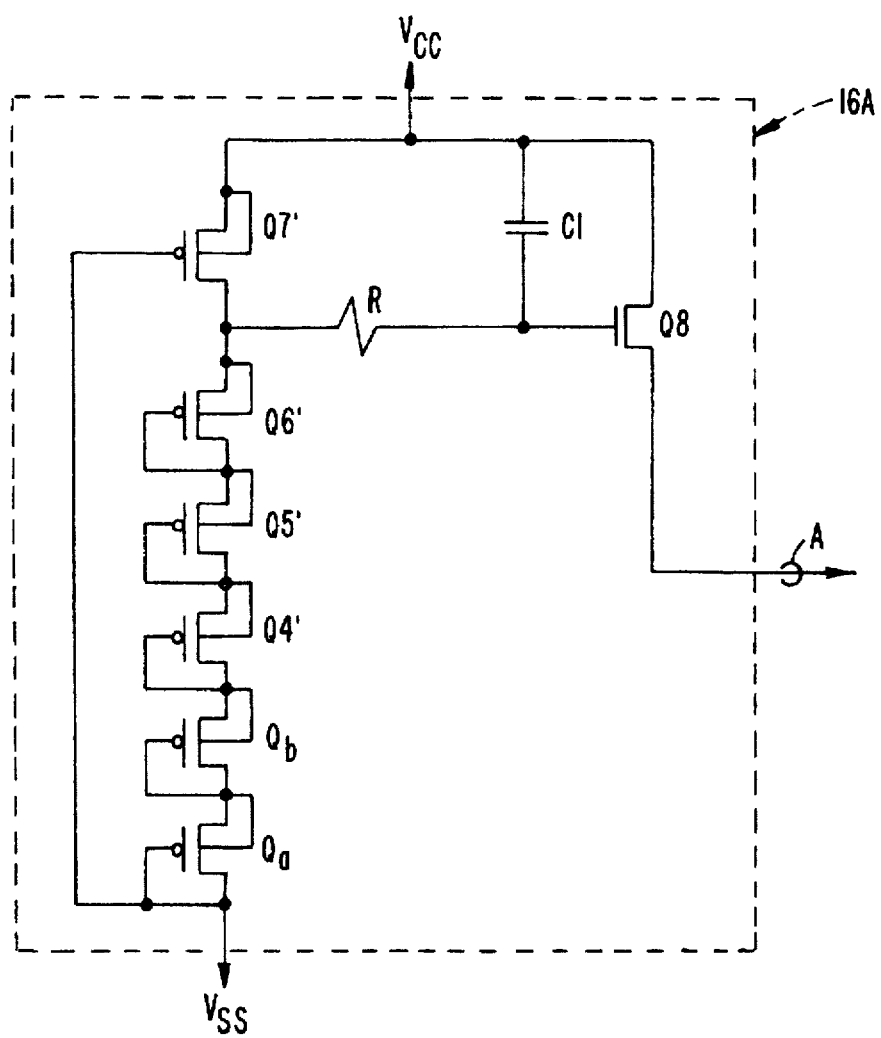
FIG. 7 is a circuit schematic of an alternate embodiment of the bias circuit shown in FIG. 3.

The bias circuit 16A of FIG. 7 comprises a series string of PMOS transistors Qa, Qb, Q4', Q5', Q6', and Q7', preferably formed with a CMOS N-well process, and each having its respective well tied to its source. The PMOS transistor Q7' is constructed with a long, narrow channel, and has its gate connected to $V_{ss}$. The transistors Qa, Qb, . . . , Q6' are constructed to have short, wide channels.

The PMOS transistor Q7' conducts only a small amount of current, so that the PMOS transistors Qa, . . . , Q6' function as zener diodes with threshold voltages slightly greater than a PMOS transistor threshold voltage, $V_{tp}$. Thus, the bias voltage developed at node A by the bias circuit 16A is five PMOS thresholds (5·$V_{tp}$), less one NMOS threshold $V_{tn}$. Thereby, the bias voltage at node A provided by the bias circuit 16A is no longer a fraction of the supply voltage $V_{cc}$, but instead is developed solely from the threshold voltages of transistors.

If the bias circuit 16A is used in situations with noise present on the supply voltage $V_{cc}$, a highly resistive element R is added between capacitor C1 and the node between Q7' and Q6'. The resistive element can be a high resistance layer or a properly biased PMOS or NMOS transistor. The important aspect is that the impedance (resistance) presented by the resistive element R is large (typically megohms) compared to the impedance looking into the junction of the PMOS transistors Q6' and Q7'. Further, the time constant RC1 preferably is long compared to the frequency of the noise transients, and short compared to the rise time of the supply voltage $V_{cc}$.

The bias circuit of FIG. 3 provides a bias voltage having a trip point independent of process parameters, but dependent on $V_{cc}$. The bias circuit of FIG. 7 provides a bias voltage with a trip point independent of $V_{cc}$, but dependent on the PMOS threshold voltage. Alternatively, a band gap generator circuit can provide a bias voltage independent of $V_{cc}$, process parameters, and temperature. This fixed voltage can then be substituted for transistors Q4 and Q5 in FIG. 3 to appear at node B. Then, as earlier, the fixed voltage at node B is raised by the magnitude of one PMOS threshold voltage by transistor Q6 and lowered by one NMOS threshold voltage by transistor Q8. As described earlier, this provides an ideal bias voltage at node A of FIG. 2 to achieve a trip point independent of all variables, including the magnitude of $V_{cc}$, temperature and both NMOS and PMOS threshold voltages.

Regardless of the bias circuit used, if the output signal from input buffer 12' of FIG. 2 drives a normal CMOS inverter, significant power is dissipated. This is because the output of input buffer 12' has an output high voltage level which is only the voltage on node A, or about 3.2 volts. This 3.2 volt level is low enough to turn on the PMOS transistor of the following stage (whose source is assumed to be at $V_{cc}$ or equal to +5 volts). Of course, this 3.2 volt level is also high enough to turn on the NMOS transistor in the following stage. Thus, although the input buffer 12' consumes no static power, the second stage driven by the input buffer 12' consumes power.

Figure 4:
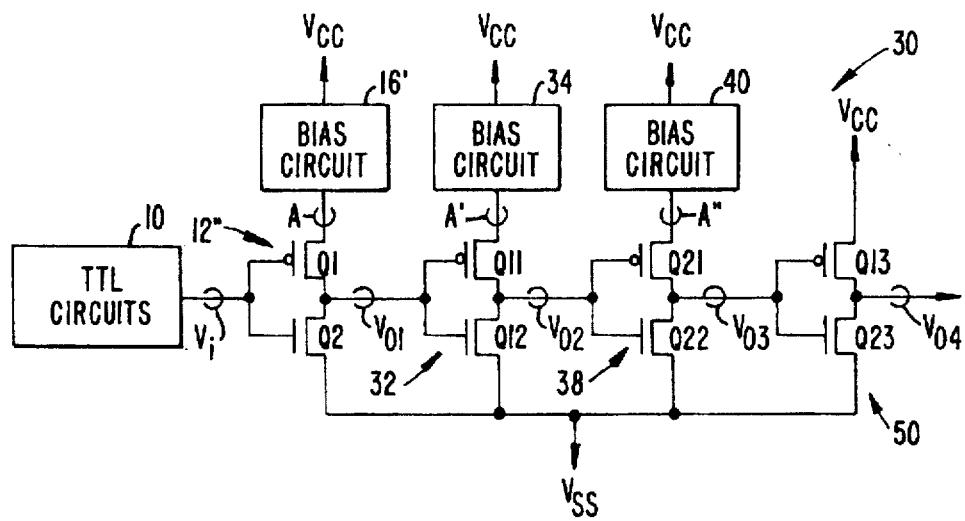
FIG. 4 is a circuit schematic of an embodiment of the invention in which successively connected CMOS stages are each provided with bias circuits to communicate a TTL signal to an output.

One solution to this problem is to cascade a series of inverters, each with its own separate bias circuit. This configuration is shown in FIG. 4. The first inverter 12" and bias circuit 16' are identical to those described in FIG. 2 and FIG. 3. These set the trip point and provide power supply noise immunity. As mentioned, however, the high level output of the first stage is only about 3.2 volts.

The second bias circuit 34 of FIG. 4 differs from the first bias circuit 16. It provides on node A' a voltage somewhat less than one PMOS threshold voltage above the voltage on node A, e.g., about 3.8 volts. A high output voltage V01, of 3.2 volts from the first stage 12" turns off the PMOS transistor Q11 of the second stage 32 whose source is 3.8 volts, not 5 volts. A low voltage from the first stage provides a high output, V02, from the second stage of 3.8 volts. The third bias circuit 40 of FIG. 4 provides a voltage on node A" less than one PMOS threshold voltage above that on node A', about 4.4 volts on node A". The 3.8 volt high level from the second stage at node V02 turns off the PMOS transistor Q21 in the third stage whose source on node A" is at 4.4 volts. Likewise, the high voltage, V03, of 4.4 volts is sufficient to turn off PMOS transistor Q13 of the CMOS inverter. Thus, the bias circuits 34 and 40 provide successively higher voltages for their respective inverters, each stepping up by less than one PMOS threshold voltage to keep all stages from dissipating any steady state power. With this configuration, the output on node V04 switches between $V_{ss}$ and $V_{cc}$, yet for any input voltage $V_i$ to the first stage below about 0.8 volts or above about 2.4 volts there is no steady state power consumed in any of the cascaded inverter stages.

The bias circuits 34 and 40 develop a bias voltage that is no more than one PMOS threshold voltage more than that of the immediately preceding stage. Other than that, the bias circuits operate in the same manner as the circuit of FIG. 3. Ultimately, the bias voltage reaches the limit of $V_{cc}$. The last CMOS stage 50 of the CMOS input buffer 30 is of conventional design.

The operation of the each of the CMOS stages in FIG. 4 is like that described in FIG. 2 and FIG. 3. A low TTL input turns off NMOS transistors Q2' and Q22, and PMOS transistors Q11 and Q13. Thus, no current is conducted by any of the CMOS stages at a low TTL logic level input. Conversely, a high TTL logic level turns off transistors Q1', Q12, Q21 and Q23 to again prevent current flow. Thus, the CMOS input buffer 30 consumes virtually no power when the input $V_i$ is either low or high TTL logic level.

Figure 5:
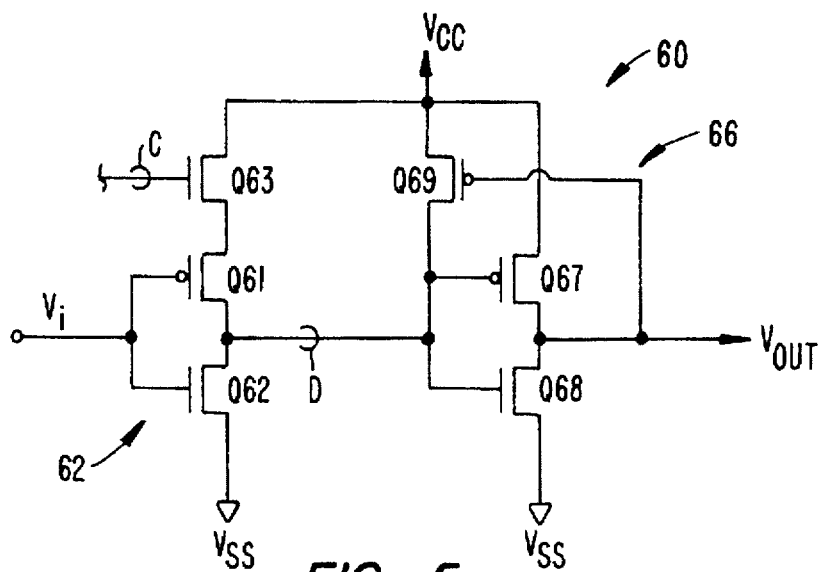
FIG. 5 is a circuit schematic of another embodiment showing use of two CMOS stages to translate the TTL input to a full CMOS compatible signal that varies between the two supply voltages.

While the circuit of FIG. 4, which uses four stages to translate the TTL input swing to a CMOS $V_{cc}/V_{ss}$ voltage swing, is useful for developing the necessary buffering to drive a high capacitive load, an improved embodiment is illustrated in FIG. 5. FIG. 5 shows a CMOS input buffer 60 with two CMOS stages: an input stage 62 that receives the TTL signal $V_i$, and an output stage 66 that supplies an output signal $V_{out}$ that varies between the supply voltages $V_{cc}$ and $V_{ss}$. The input stage corresponds to FIG. 2 or FIG. 4, and includes a PMOS transistor Q61 coupled to $V_{cc}$ through a source follower NMOS transistor Q63, and to ground through an NMOS transistor Q62. The transistors Q61, Q62 have approximately equal transconductances. The TTL input is applied as $V_i$ to the connected gates of the CMOS transistor pair, Q61 and Q62, with the output appearing at node D. The gate terminal of the NMOS transistor Q63 is connected to node C of the bias circuit 16 (FIG. 3), thereby supplying a bias voltage to the source terminal of the PMOS transistor Q61 that, as explained above, is a fixed fraction of the supply voltage $V_{cc}$ less an NMOS threshold, and plus a PMOS threshold. Thus, the input stage 62 has a trip point at approximately 1.6 volts if $V_{cc}$ is approximately 5 volts.

The output stage 66 of the CMOS input buffer 60 is a CMOS inverter with the CMOS transistor pair Q67, Q68 having gate terminals connected to node D. The output from stage 66, $V_{out}$, drives the next stage of logic and is also applied to the gate terminal of PMOS feedback transistor Q69 whose source and drain terminals connect between $V_{cc}$ and node D.

The CMOS input buffer 60 operates as follows. When the input signal $V_i$ is a TTL low logic level (0.8 volts or less), the NMOS transistor Q62 turns off, and the PMOS transistor Q61 turns on, pulling node D up to the bias voltage of the source terminal of the source follower transistor Q63. The NMOS transistor Q68 of the output stage 66 turns on, pulling the output signal $V_{out}$ toward $V_{ss}$. With $V_{out}$ near ground, the PMOS feedback transistor Q69 is turned on, pulling node D all the way to $V_{cc}$, and turning off the PMOS transistor Q67. The NMOS source follower transistor Q63 pulls its source up to about 3.2 volts, but does not prevent it from becoming more positive. Instead, it keeps its source from going more negative than 3.2 volts. Thus, when PMOS transistor Q69 turns on, pulling node D to $V_{cc}$, NMOS transistor Q63 does not interfere. (At this time the source of Q63 is pulled to $V_{cc}$ through Q69 and Q61.) With the input signal $V_i$ at TTL low and node D at $V_{cc}$, the CMOS input buffer 60 consumes virtually no power. The input stage has no current path from $V_{cc}$ to $V_{ss}$ because the NMOS transistor Q62 is off. Similarly, no current path from $V_{cc}$ to $V_{ss}$ exists in the output stage 66 because the PMOS transistor Q67 is off.

When the input signal $V_i$ is a TTL logic high level, the PMOS transistor Q61 of the input stage is turned off, because its source is only 3.2 volts. The NMOS transistor Q62 is turned on. NMOS transistor Q62 has a much larger transconductance than PMOS transistor Q69. Thus, initially, NMOS transistor Q62 overpowers PMOS transistor Q69 and pulls node D toward ground. In the output stage 66 the NMOS transistor Q68 is turned off, and the PMOS transistor Q67 is turned on, pulling the output $V_{out}$ toward $V_{cc}$, turning off the PMOS feedback transistor Q69. After the output switches high, the CMOS input buffer 60 consumes virtually no power, because transistors Q61, Q69 and Q68 are all off.

There is, however, some hysteresis exhibited by the input stage 62 that may be undesirable. This is explained below. A TTL low input to the input stage 62 pulls node D first to 3.2 volts by Q61 and then to $V_{cc}$ by the feedback transistor Q69. When the input $V_i$ switches to a TTL logic high level, to switch node D low, the current through the NMOS transistor Q62 must momentarily exceed the sum of the currents for both PMOS transistors Q61 and Q69. Thus, when $V_i$ switches high, the trip point is that voltage at which the current through transistor Q62 exceeds the current through transistor Q61 by an amount equal to the current through feedback transistor Q69. Conversely, when the input signal $V_i$ switches low, the trip point is that voltage at which the current through PMOS transistor Q61, without help from the off PMOS transistor Q69, exceeds the current through NMOS transistor Q62. Thus, the input buffer 62 has a relatively low trip point when the input switches from high to low, but a relatively high trip point when the input switches from low to high, that is, has hysteresis.

Figure 6:
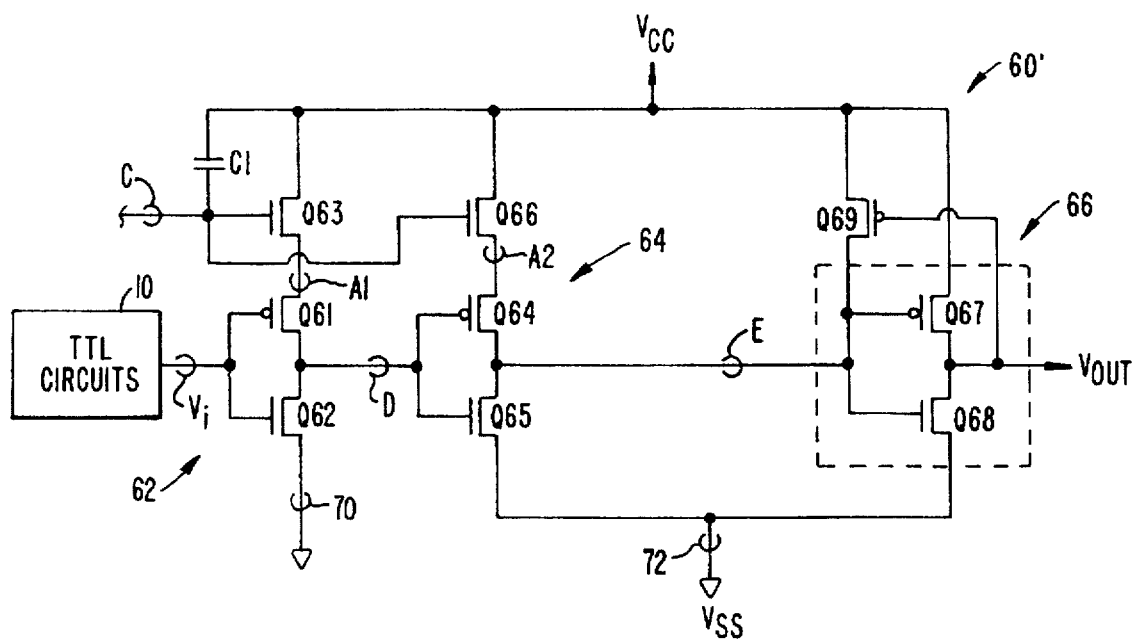
FIG. 6 is a circuit schematic of a preferred embodiment of the static input buffer.

If hysteresis is not wanted, an intermediate stage containing the feedback transistor Q69 can be added between the input and output stages. The intermediate stage 64 is illustrated in FIG. 6, along with the input and output stages 62 and 66, respectively. FIG. 6 is an embodiment of the invention that exhibits very little of the hysteresis of the CMOS input buffer 60 shown in FIG. 5.

The transistors Q61 and Q62 in the input stage 62 preferably are sized so that their transconductances are equal. This is not necessary for transistors Q64 and Q65 in the second stage 64. Each of CMOS stages 62 and 64 receives a bias voltage at nodes A1 and A2, respectively. The bias voltage can be provided by a bias circuit 16 (FIG. 3) at node C, and coupled to nodes A1 and A2 by NMOS source follower transistors Q63 and Q66, respectively. Transistor Q8 in FIG. 3 represents either transistor Q63 or Q66 in FIG. 6. In FIG. 6 the output node D of the input stage 62 is coupled to the gate terminals of the PMOS Q64 and NMOS transistor Q65 of the intermediate stage 64. The output E of the intermediate stage 64 is coupled to the gate terminals of the CMOS inverter circuit—transistors Q67 and Q68. As before (FIG. 5), output $V_{out}$ is connected to the gate terminal of PMOS feedback transistor Q69, whose drain node now connects to node E.

When $V_i$ is a high TTL logic level, usually 2.4 volts or more, node D is pulled toward ground by the NMOS transistor Q62, while node E is pulled toward the bias voltage at node A2 by the PMOS transistor Q64, in turn causing Q68 to pull the output $V_{out}$ low. After $V_{out}$ switches low, node E is pulled from the bias voltage at node A2 all the way to $V_{cc}$ by the feedback transistor Q69. At this time, transistors Q61, Q65 and Q67 are all off, so there is no current path. When input $V_i$ switches to a TTL logic low level, the NMOS transistor Q62 turns off. The on PMOS transistor Q61 pulls node D toward the bias voltage at node A1, thereby turning off the PMOS transistor Q64 and turning on the NMOS transistor Q65 to pull node E near ground. This turns off NMOS transistor Q68 and turns on PMOS transistor Q67 to pull the output $V_{out}$ of the inverter circuit toward $V_{cc}$, and the feedback transistor Q69 turns off. At this time, transistors Q62, Q64, Q68 and Q69 are all off, so there is no current path. Although the intermediate stage exhibits some hysteresis, the input stage 62 has very high voltage gain near its trip point so a very small change in input voltage changes the output voltage of the first stage enough to overcome the hysteresis of the second stage. Therefore, the buffer of FIG. 6 exhibits very little hysteresis at the input.

Because of the bonding pad layout on the integrated circuit, some input buffers usually are located across the chip from the $V_{ss}$ pad. The input buffer 60 (FIG. 5) or the input buffer 60' (FIG. 6), as well as any companion input buffers, normally is coupled to a metal interconnection to receive $V_{ss}$. The connection has a non-negligible resistance. At any given time, some of the input buffers may receive an input voltage near their trip point, during which time both the NMOS and PMOS transistors of the input stage simultaneously conduct. The unpredictable current drawn by the various stages of the multiple input buffers causes a voltage drop across this unwanted resistance, in turn causing the $V_{ss}$ supply voltage experienced by any specific input buffer, and particularly the input stage 62, to fluctuate. This fluctuation of $V_{ss}$ affects the trip point of the stages of the input buffer, particularly input stage 62, making the switching threshold voltage of the input buffer unpredictable.

To eliminate this problem caused by the resistance of the $V_{ss}$ connection, the input stage 62 preferably is provided with it own separate connection 70 from the $V_{ss}$ pad of the chip, as illustrated in FIG. 6. That is, each input buffer is provided with a separate conductor to transmit $V_{ss}$ from the $V_{ss}$ pad to the input stage of that buffer. Thus, any voltage drop across the resistance exhibited by connection 70 arises from that input stage, not from the current drawn by other input buffers or other circuitry. In addition, NMOS transistor Q62 is made wider to increase its transconductance ($g_n$). The NMOS transistor Q62 and the resistance (R) of the $V_{ss}$ connection 70 result in an equivalent transistor transconductance calculated:

$$g_e = g_n/(1 + g_n \cdot R) \quad \text{(Eq. 8)}$$

where, $g_n$ is the transconductance of the NMOS transistor Q62, R is the resistance of the $V_{ss}$ wire 70, and $g_e$ is the equivalent transconductance of the combination of the NMOS transistor Q62 and the resistance R.

Because the $V_{ss}$ wire resistance R and the transconductance $g_n$ of the NMOS transistor Q62 are controllable quantities, the equivalent transconductance $g_e$ can be made equal to the equivalent transconductance of the PMOS transistor Q61 which is itself reduced by the source resistance of the source follower transistor Q63. Thus, the resistance of connection 70 becomes part of the design, lowering the effective $g_n$ of the NMOS transistor Q62 to approximately equal the (reduced) $g_p$ of the PMOS transistor Q61.

Thus, our invention provides a CMOS static input buffer that operates from voltage differential less than that of the supply voltages ($V_{cc}$, $V_{ss}$) so that at least one of the transistors of the CMOS pair is off when in the nonswitching state, thereby minimizing power consumption. Further, the transistors of the CMOS pair are sized so that their respective transconductances (or equivalent transconductances, when the $V_{ss}$ trace and source follower resistances are taken into account) are equal, making the trip points of the buffer insensitive to symmetric power supply noise. Finally, the CMOS buffer of the present invention is insensitive to process variations in PMOS and NMOS threshold voltages.

Those skilled in this art will realize that the teachings of our invention can be used whenever a buffer is needed, for example, in memory devices, microprocessors, and the like, to translate lower voltage swings to the higher voltage swings of CMOS circuitry. If low voltage CMOS circuitry (3.0 or 3.3 volts) is mixed with high voltage CMOS circuitry (5.0 volts), our invention can provide a buffer on the high voltage CMOS to receive data from the low voltage CMOS, achieving the advantages described above. Furthermore, the invention can be used for circuits operating internally on a reduced voltage but receiving a high external supply voltage. In these circuits low voltage signals in part of the circuit are converted to high voltage signals in another part of the circuit.

Although the foregoing has been a description of the preferred embodiments, it should be appreciated that the scope of the invention is defined by the appended claims.

What is claimed is:

1. A CMOS input buffer adapted for use with a positive power supply voltage and a lower supply voltage, each subject to symmetric voltage variations, the CMOS input buffer comprising:

an NMOS transistor and a PMOS transistor connected between the lower supply voltage and an upper supply voltage to form a series current path therebetween, the NMOS and PMOS transistors having substantially equal transconductances; and bias means for providing the upper supply voltage from the positive supply voltage which positive supply voltage is greater than the upper supply voltage, the bias means including first circuit means coupled to the positive supply voltage, the first circuit means including capacitive means coupled to the positive supply voltage to communicate variations in the positive supply voltage to the bias means for causing substantially the same variations to occur in the upper supply voltage, said variations symmetric with variations in the lower supply voltage.

2. The CMOS input buffer of claim 1, wherein the PMOS transistor is coupled between the upper supply voltage and an output node, the NMOS transistor is connected between the lower supply voltage and the output node, and the NMOS and PMOS transistors have gate leads coupled together and to an input node.

3. The CMOS input buffer of claim 1, wherein the bias means comprises a plurality of MOS transistors, each having source and drain leads connected to one another to form a series current path between the positive supply voltage and the lower supply voltage, to provide a bias voltage, and a source follower MOS transistor coupled to receive the bias voltage, and to the PMOS transistor for providing from the bias voltage the upper supply voltage.

4. The CMOS input buffer of claim 3, wherein each of the plurality of MOS transistors comprises a PMOS transistor having a gate lead and a source lead connected together, one of the PMOS transistors having the source lead connected to the upper supply voltage and a drain lead connected to the source lead of another of the plurality of MOS transistors.

5. A CMOS input buffer operable from a supply voltage and a lower voltage to receive a TTL type input signal and to provide a CMOS output signal, the supply voltage and the lower voltage subject to symmetric voltage variations, the input buffer comprising:

first and second input stages interconnected in cascade one after the other, each one of the first and second input stages including, a pair of CMOS transistors formed to have substantially equal transconductances and connected to form a series current path between a bias voltage source and the lower voltage source, an interconnection between the pair of CMOS transistors forming an output terminal, the pair of CMOS transistors each having gate leads coupled together to form an input terminal, wherein the input terminal of a first input stage forms an input terminal for a TTL type input signal, the output terminal of the first input stage being coupled to the input terminal of a second input stage, the CMOS output signal being provided at the output terminal of the second input stage;

first and second bias means for providing the bias voltage source from the supply voltage, the supply voltage greater than the bias voltage source, the first and second bias means including capacitive circuit means coupled to cause the bias voltage source to vary symmetrically with symmetrical variations in the supply voltage and in the lower voltage, the bias voltage source for the second input stage being less than the bias voltage source for the first stage by at least an MOS threshold voltage.

6. The CMOS input buffer of claim 5, further comprising a third input stage, wherein the bias means for the first input stage provides a first bias voltage, the bias means for the second input stage provides a second bias voltage that is more positive than the first bias voltage by no more than one PMOS transistor threshold voltage, and the bias means for the third input stage provides a third bias voltage that is more positive than the second bias voltage by no more than approximately one PMOS transistor threshold voltage.

7. The CMOS input buffer of claim 6, wherein one of each of the pairs of CMOS transistors is a PMOS transistor having a source lead coupled to the corresponding bias means of each input stage, and each of the bias means including means to compensate for the threshold voltage of the PMOS transistor.

8. A CMOS input buffer adapted for use with a positive supply voltage and a lower supply voltage, each subject to symmetric voltage variations, the CMOS input buffer comprising:

an NMOS transistor connected between the lower supply voltage and an output node;

a PMOS transistor connected between an upper supply voltage and the output node, the NMOS and PMOS transistors each having gate leads connected together to form an input node, and the NMOS and PMOS transistors having substantially equal transconductances; and bias means for providing upper voltage from the positive supply voltage, the upper voltage being less than the positive supply voltage, the bias means including capacitive circuit means coupled to the positive supply voltage to cause the upper supply voltage to vary symmetrically with symmetrical variations of the positive and lower supply voltages, the bias means further including a plurality of MOS transistors, each having source and drain leads connected to one another to form a series current path between the positive supply voltage and the lower supply voltage, to provide a bias voltage, and a source follower MOS transistor coupled to receive the bias voltage, and to the PMOS transistor for providing the bias voltage from the upper supply voltage.

9. A CMOS input buffer adapted for use with a positive power supply voltage and a lower supply voltage, each subject to symmetric voltage variations, the CMOS input buffer comprising:

an input stage having an NMOS transistor and a PMOS transistor connected between the lower supply voltage and a first bias voltage to form a series current path therebetween; and a bias circuit coupled between the positive power supply voltage and the lower supply voltage for generating the first bias voltage, the bias circuit including a capacitive element coupled to the positive supply voltage to communicate variations in the positive supply voltage to the bias circuit for causing substantially the same variations to occur in the bias voltage, said variations being symmetric with variations in the lower supply voltage.

10. The CMOS input buffer of claim 9 wherein gate terminals of each of the NMOS and PMOS transistors couple together and to an input of the CMOS input buffer, and drain terminals of each of the NMOS and PMOS transistors couple together and to an output of the input stage.

11. The CMOS input buffer of claim 10 further comprising a second stage having an NMOS transistor and a PMOS transistor connected between the lower supply voltage and a second bias voltage to form a series current path therebetween, the second bias voltage being generated by the bias circuit, wherein, gate terminals of each of the NMOS and PMOS transistors in the second stage couple together and to the output of the input stage.

12. The CMOS input buffer of claim 11 further comprising a final stage having an NMOS transistor and a PMOS transistor connected between the lower supply voltage and the positive power supply voltage to form a series current path therebetween, gate terminals of each of the NMOS and PMOS transistors in the final stage being coupled together and to an output of the second stage, and drain terminals of each of the NMOS and PMOS transistors in the final stage being coupled together and to an output of the CMOS input buffer, wherein, the final stage further includes a feedback circuit coupled between the output of the final stage and the input of the final stage.

13. The CMOS input buffer of claim 12 wherein the feedback circuit comprises a PMOS transistor having a source terminal coupled to the positive power supply voltage, a drain terminal coupled to the input of the final stage, and a gate terminal coupled to the output of the final stage.

14. The CMOS input buffer of claim 10 further comprising a final stage having an NMOS transistor and a PMOS transistor connected between the lower supply voltage and the positive power supply voltage to form a series current path therebetween, gate terminals of each of the NMOS and PMOS transistors in the final stage being coupled together and to an output of the input stage, and drain terminals of each of the NMOS and PMOS transistors in the final stage being coupled together and to an output of the CMOS input buffer, wherein, the final stage further includes a feedback circuit coupled between the output of the final stage and the input of the final stage.

15. The CMOS input buffer of claim 10 wherein the bias circuit further comprises:
   a voltage divider including a plurality of resistive elements coupled between the positive power supply voltage and the lower power supply voltage.

16. The CMOS input buffer of claim 15 wherein said bias circuit further comprises a first NMOS transistor having a gate terminal coupled to the voltage output of the voltage divider, a drain terminal coupled to the positive power supply voltage, and a source terminal coupled to the first bias voltage.

17. The CMOS input buffer of claim 16 wherein said bias circuit further comprises a second NMOS transistor having a gate terminal coupled to the voltage output of the voltage divider, a drain terminal coupled to the positive power supply voltage, and a source terminal coupled to a second bias voltage.

18. The CMOS input buffer of claim 16 wherein said plurality of resistive elements in said voltage divider comprise a plurality of gate-drain connected PMOS transistors coupled in series with each having its body terminal connected to its source terminal.

* * * * *